United States Patent
Takenaka

(10) Patent No.: US 7,588,350 B2
(45) Date of Patent: Sep. 15, 2009

(54) LIGHT EMITTING DEVICE MODULE

(75) Inventor: Hiromitsu Takenaka, Yokohama (JP)

(73) Assignee: Samsung Electronics Co., Ltd., Suwon-si (KR)

( * ) Notice: Subject to any disclaimer, the term of this patent is extended or adjusted under 35 U.S.C. 154(b) by 130 days.

(21) Appl. No.: 11/606,111

(22) Filed: Nov. 30, 2006

(65) Prior Publication Data

US 2007/0147044 A1    Jun. 28, 2007

(30) Foreign Application Priority Data

Dec. 27, 2005  (JP)  ............................. 2005-374920
Aug. 21, 2006  (KR)  ...................... 10-2006-0078763

(51) Int. Cl.
 *F21V 29/00*   (2006.01)
(52) U.S. Cl. ...................... 362/294; 362/547; 362/373; 362/800; 362/249; 361/701; 361/704; 361/707
(58) Field of Classification Search .................. 362/294, 362/800, 547; 361/701, 606, 704, 707
See application file for complete search history.

(56) References Cited

U.S. PATENT DOCUMENTS 6,045,240 A * 4/2000 Hochstein ................... 362/294
2006/0087843 A1* 4/2006 Setomoto et al. ............ 362/249

FOREIGN PATENT DOCUMENTS

JP        3329716 B1    7/2002
JP        2005-159262 A  6/2005

* cited by examiner

*Primary Examiner*—Sandra L O'Shea
*Assistant Examiner*—Jessica L McMillan
(74) *Attorney, Agent, or Firm*—Sughrue Mion, PLLC

(57) ABSTRACT

A light emitting device module is provided. The light emitting device module includes a plurality of light emitting devices which are formed adjacent to each other, a plurality of radiating bases which support at least one of the plurality of the light emitting devices, and a heat transfer prevention unit which prevents heat from being conducted between the plurality of the radiating bases, wherein distances between the adjacent light emitting devices are less than mean values of the length along the adjacent direction of the adjacent light emitting devices.

9 Claims, 5 Drawing Sheets

LIGHT EMITTING DEVICE MODULE

CROSS-REFERENCE TO RELATED PATENT APPLICATION

This application claims priority from Japanese Patent Application No. 2005-374920, filed on Dec. 27, 2005 in the Japanese Intellectual Property Office, and Korean Patent Application No. 10-2006-0078763, filed on Aug. 21, 2006 in the Korean Intellectual Property Office, the disclosures of which are incorporated herein in their entirety by reference.

BACKGROUND OF THE INVENTION

1. Field of the Invention

A light emitting device module consistent with the present invention includes a plurality of light emitting devices, and achieves a reduced thermal influence on the light emitting devices.

2. Description of the Related Art

Light emitting device modules are widely used in projectors, displays, indicators, traffic lights, and lighting devices. Related light emitting device modules emit white light or colored light by combining light emitting devices having different wavelengths, and increase the brightness of the light by using solid light emitting devices, such as light emitting diodes (LEDs).

In these light emitting device modules, in order to avoid the influence of self-heating when emitting light, each light emitting device is arranged separately on electrodes or a substrate.

As an example of such a light emitting device module, Japanese Patent No. 3329716 (hereinafter, Cited Reference 1) discloses a light emitting device module which includes chip type LEDs, on which LED chips, each emitting green, red and blue light, are arranged on a common electrode. The size of the common electrode may be maximized according to radiating properties or reflectivity. Referring to FIG. 1 of Cited Reference 1, the distance between adjacent LED chips, which have an approximately square shape, is obviously greater than one side of the square.

Japanese Patent Publication No. 2005-159262 (hereinafter, Cited Reference 2) discloses a light emitting device module which includes at least three approximately square-shaped light emitting devices arranged at similar intervals on a body formed of resins, such as ceramics and epoxy, and a light transparent member covering the light emitting diodes. The interval between adjacent light emitting devices is the same or greater than one side of the approximate square.

These related light emitting device modules have the following problems.

In Cited References 1 and 2, since a plurality of adjacent light emitting devices are separated at an interval greater than a size of a light emitting surface of each of the light emitting devices on a radiating member, such as electrodes or a substrate, the light emitting devices are cooled by radiating of the radiating member. However, a radiating amount is increased. Therefore, the light emitting devices are likely to have a thermal influence on each other. For example, a poor luminous efficiency decreases the brightness or lifetime of the light emitting devices.

In order to avoid a thermal influence, a radiating member should be large, or arranged in a wide interval. Thus, arranging light emitting devices adjacent to each other causes problems.

In a light emitting device module which includes a plurality of light emitting devices arranged at specific intervals to each other, when one optical system focuses light emitted from each device, the light efficiency is poor or an aberration is worsened when the light emitting devices are arranged on a line that is slightly off the axis of the optical system. For example, when a plurality of light emitting devices are used in order to improve brightness, light efficiency may be poor. In addition, when colors are indicated by using light having a plurality of wavelengths, color spots may occur.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a light emitting device module in which a thermal influence of a plurality of light emitting devices on each other is reduced, even when the light emitting devices are adjacent to each other.

According to an aspect of the present invention, there is provided a light emitting device module which includes a plurality of light emitting devices formed adjacent to each other, a plurality of radiating bases which support at least one of the plurality of the light emitting devices, and a heat conductive prevent unit which prevents heat from being conducted between the plurality of the radiating bases, wherein the plurality of the adjacent light emitting devices is arranged such that an adjacent distance between two light emitting devices is less than a mean value of a width of each of the adjacent light emitting devices.

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF EXEMPLARY EMBODIMENTS OF THE INVENTION

Figure 1A:
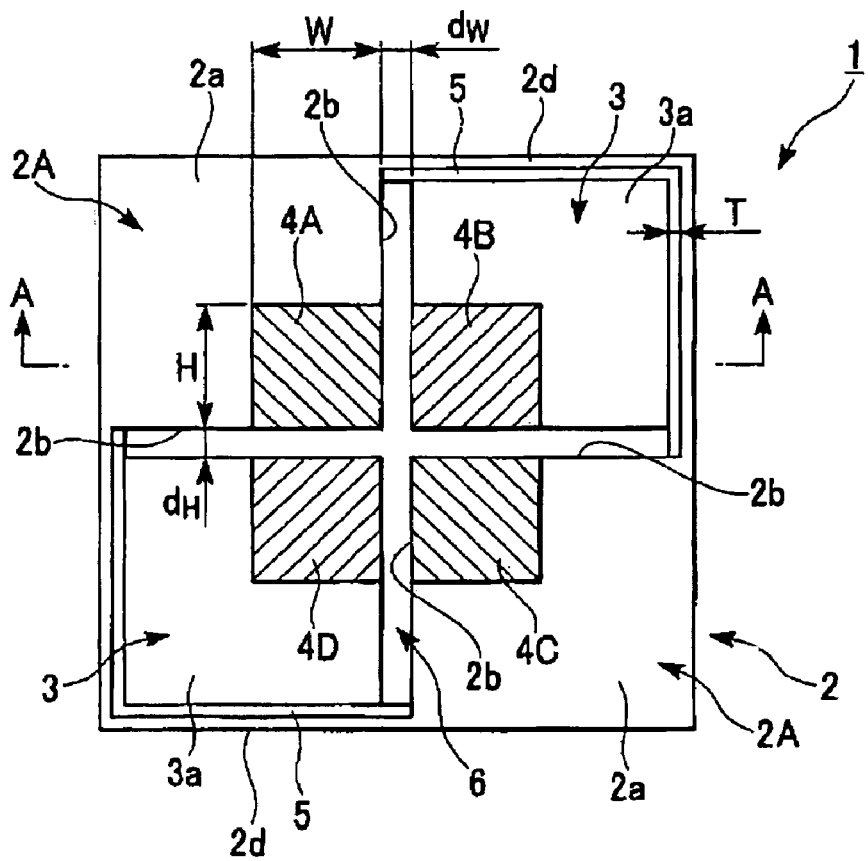
FIG. 1A is a schematic plan view of a light emitting device module according to an exemplary embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus their description will be omitted.

Figure 1B:
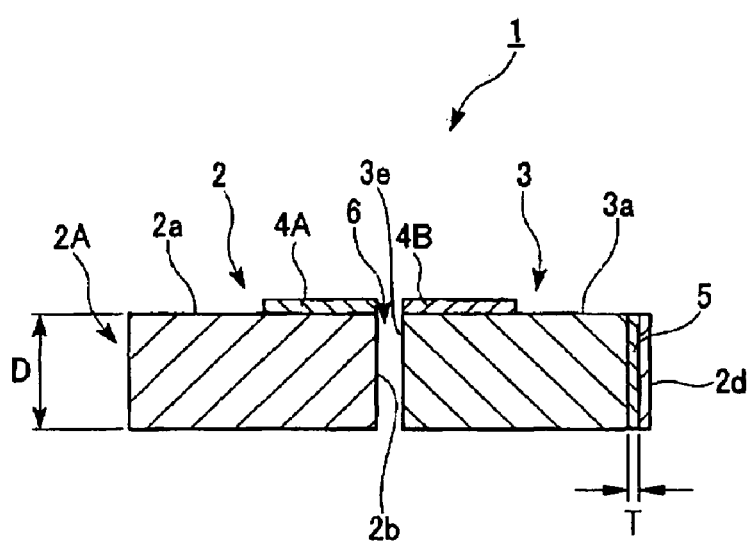
FIG. 1B is a cross-sectional view taken along a line A-A of FIG. 1A.
Figure 2:
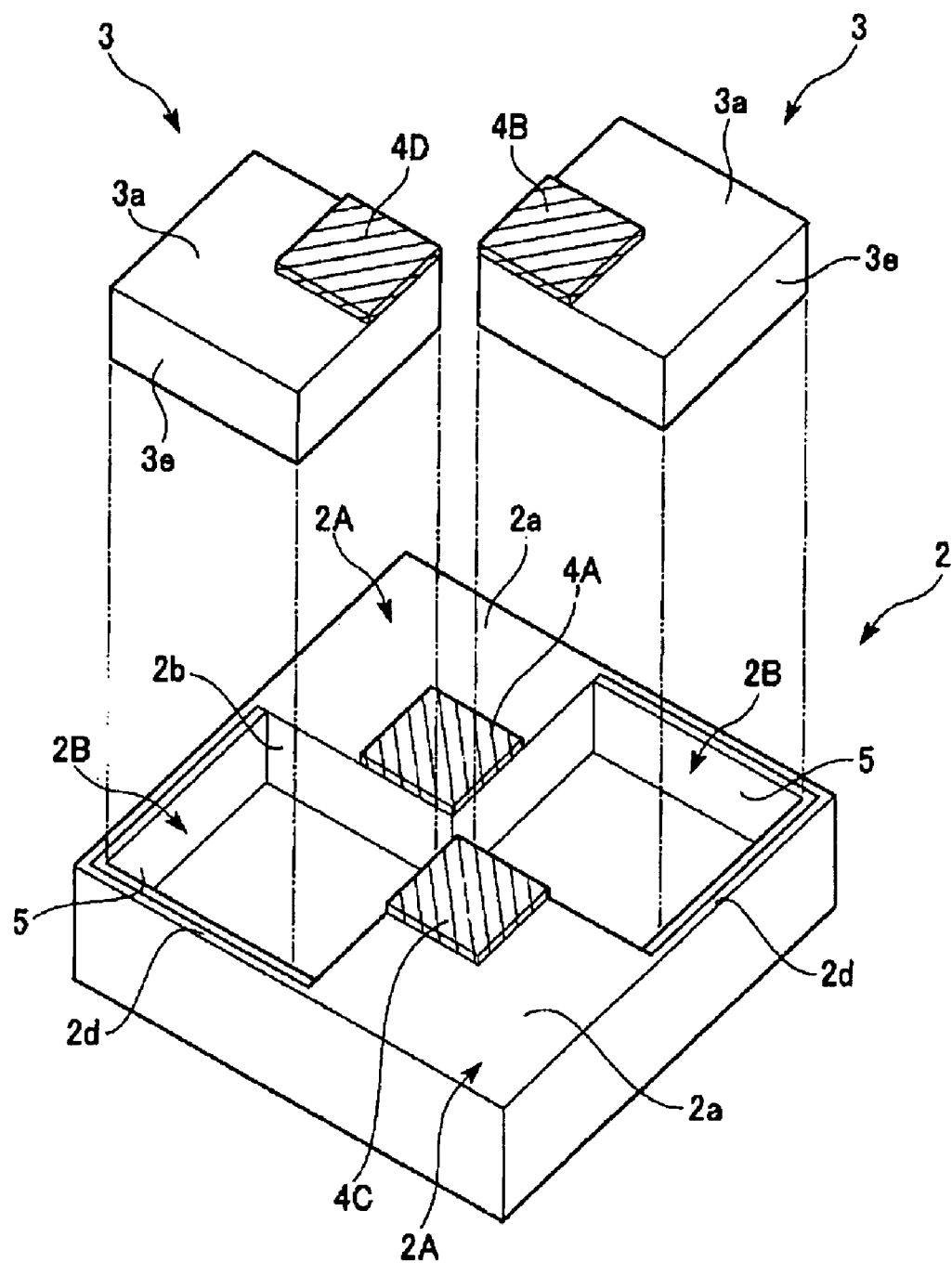
FIG. 2 is a perspective view of the light emitting device module of FIG. 1A according to an exemplary embodiment of the present invention.
Figure 3A:
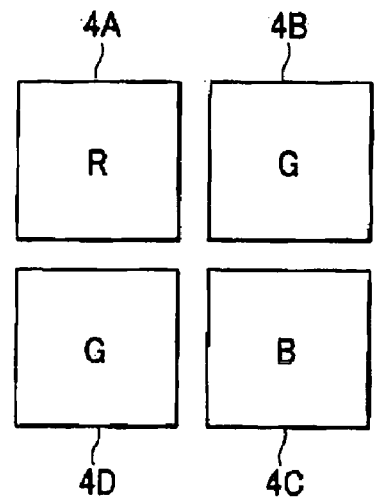
FIGS. 3A, 3B and 3C are plan views of examples of arranging the light emitting device module of FIG. 1A according to an exemplary embodiment of the present invention.
Figure 3B:
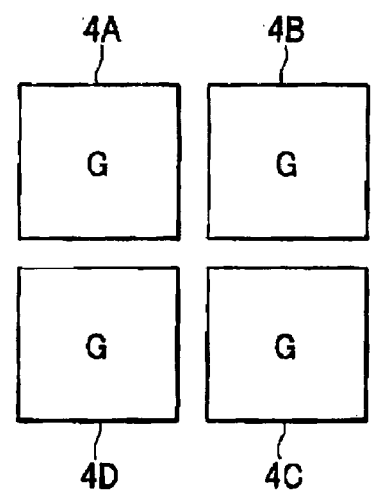
Figure 3C:
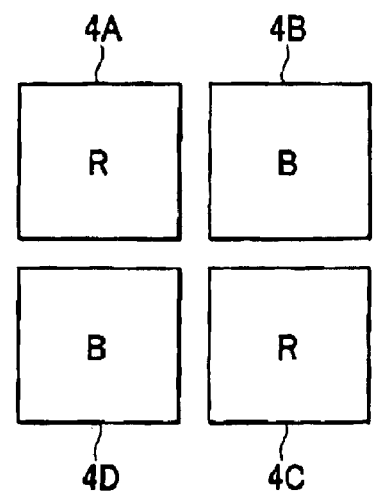

FIG. 1A is a schematic plan view of a light emitting device module 1 according to an exemplary embodiment of the present invention. FIG. 1B is a cross-sectional view taken along a line A-A of FIG. 1A. FIG. 2 is a perspective view of the light emitting device 1 according to an exemplary embodiment of the present invention. FIGS. 3A, 3B and 3C are plan views of examples of distributing the light emitting device according to an exemplary embodiment of the present invention.

The light emitting device module 1 includes a plurality of light emitting devices, and can be appropriately used in a projector, a display, an indicator, a traffic light, or a lighting device as a light source by emitting light from the plurality of light emitting devices.

Referring to FIGS. 1A, 1B and 2, the light emitting device module 1 includes light emitting devices 4A, 4B, 4C and 4D, a main frame 2, a thermal insulator 5 and a nest frame 3.

Referring to FIG. 1A, the light emitting devices 4A, 4B, 4C and 4D, which each have an emissive surface, are solid light emitting devices such as light emitting diodes (LEDs). The emissive surface is a rectangle having a length H and a width W. Since a known structure can be used in a chip structure of an LED, FIG. 1A is an archetype LED module. Although not illustrated in FIG. 1A, it will be understood by those of ordinary skill in the pertinent art that an electrode or an electric wire can be used in the light emitting devices 4A, 4B, 4C and 4D, according to the structure of the light emitting devices 4A, 4B, 4C and 4D.

The wavelength and rated power of each of the light emitting devices 4A, 4B, 4C and 4D may be determined. A size of the emissive surface can be varied according to the wavelength and the rated power. According to exemplary embodiments of the present invention, the size of the emissive surface is H×W.

The main frame 2 supports the light emitting devices 4A and 4C so that the light emitting devices 4A and 4C may be arranged diagonally to each other. The main frame 2 transmits light emitted from the light emitting devices 4A and 4C in a direction perpendicular to and away from the page of FIG. 1A. Simultaneously, the main frame 2 transmits and radiates heat generated from the light emitting devices 4A and 4C.

A cross section of the main frame 2 is approximately rectangular. The main frame 2 is a block member which has a thickness D. The main frame 2 includes a plurality of through hole parts 2B formed in one diagonal direction with respect to each other, and a plurality of convex parts 2A formed in the other diagonal direction with respect to each other. The plurality of convex parts 2A are formed to be slightly separated from each other. Each of the plurality of convex parts 2A is formed to have a rectangular parallelepiped shape. That is, each of the plurality of through hole parts 2B includes an L-shaped sidewall 2d, which connects the plurality of convex parts 2A to each other, and a convex part side surface 2b of the convex part 2A.

The shape of the main frame 2 as seen from above is divided into 4 rectangular parts by the plurality of convex parts 2A and the plurality of through hole parts 2B.

The main frame 2 may be formed of any material having good thermal conductivity and heat radiation properties, such as a metal, a semiconductor, a ceramic, or synthetic resins.

A light emitting device loading surface 2a, on which the light emitting devices 4A and 4C are formed, is formed on each of the plurality of convex parts 2A. The area of the light emitting device loading surface 2a is greater than the area of an emissive surface of each of the light emitting devices 4A and 4C. In addition, along edges of the center of the main frame 2, the light emitting devices 4A and 4C are arranged so that each of the sides of the light emissive surface approximately makes an array with each of the edges of the convex part 2A.

The light emitting device loading surface 2a is connected to the light emitting devices 4A and 4C, and can be electrically insulated or conductive. In order to efficiently radiate light from the light emitting devices 4A and 4C towards a protrusion of the convex part 2A, reflective surfaces may be formed at least on regions on which the light emitting devices 4A and 4C are arranged.

The thermal insulator 5 prevents heat from conducting between the main frame 2 and the nest frame 3. The thermal insulator 5 decreases thermal conduction between the main frame 2 and the nest frame 3. Thus, the main frame 2 and the nest frame 3 are approximately thermally insulated from each other. The thermal insulator 5 is formed on an opposition part of the main frame 2 and the nest frame 3 in order to have a layered shape.

The thermal insulator 5 is formed of a material that is less thermally conductive than the main frame 2 and the nest frame 3.

The thermal insulator 5 is formed of synthetic resins, which also function as adhesives which adhere the nest frame 3 to the main frame 2. Referring to FIGS. 1B and 2, the thermal insulator 5 approximately covers an inner surface of the sidewall 2d, and is formed to have a thickness T.

The thickness T of the thermal insulator 5 is determined according to the material and thermal conductivity of the thermal insulator 5, and the heat radiating amount of the light emitting devices 4A, 4B, 4C and 4D, so that required thermal insulating properties of the thermal insulator 5 may be achieved. When the main frame 2 and the nest frame 3 should be electrically insulated, the thickness T of the thermal insulator 5 is determined so that the required electrical resistance may be achieved.

The nest frame 3 radiates light from the light emitting devices 4B and 4D. Simultaneously, the nest frame 3 supports the light emitting devices 4A and 4C, and is adjacent to the light emitting devices 4A and 4C. A nest frame 3 is arranged in each of the through hole parts 2B of the main frame 2.

The nest frame 3 is formed of the same material as the main frame 2.

The shape of the nest frame 3 is a rectangular parallelepiped which has a thickness D.

A light emitting device loading surface 3a, on which the light emitting devices 4B and 4D are arranged, is formed on the nest frame 3. The area of the light emitting device loading surface 3a is greater than the area of an emissive surface of each of the light emitting devices 4B and 4D. The surface condition of the light emitting device loading surface 3a is the same as the surface condition of the light emitting device loading surface 2a which is included in the main frame 2.

As illustrated in FIG. 2, the nest frame 3 is arranged in each of the through hole parts 2B so that the each light emitting device loading surface 3a is towards a center of the main frame 2. The nest frame 3 is affixed to the sidewall 2d. The thermal insulator 5 is arranged between the nest frame 3 and the sidewall 2d.

As a result of this structure, each of the light emitting device loading surfaces 2a and 3a is arranged to have the same height.

The light emitting devices 4A and 4B are adjacently arranged so that there is a gap 6 with a width dW between them in the width W direction. Similarly, the light emitting devices 4D and 4C are adjacently arranged so that there is a gap 6 with a width dW between them in the width W direction.

The light emitting devices 4A and 4D are adjacently arranged so that there is a gap 6 with a width dH between them in the length H direction. Similarly, the light emitting devices 4B and 4C are adjacently arranged so that there is a gap 6 with a width dH between them in the length H direction.

The widths dW and dH of the gap 6 are each a minimum value, and satisfy dW<W and dH<H when the light emitting devices 4A through 4D are electrically insulated from an atmosphere, such as air or inert gas, and meet a permitted limit of a thermal influence of the atmosphere on each of the adjacent light emitting devices. Accordingly, the light emitting devices 4A, 4B, 4C and 4D are arranged adjacent to each other, and the distance between each of the light emitting devices 4A, 4B, 4C and 4D is sufficiently small.

By this structure, since the thermal insulator 5 is formed between the nest frames 3 and approximately insulates a thermal conductive path, each of the nest frames 3 constitutes an independent radiating base.

The gap 6 approximately insulates a thermal conductive path from the nest frame side surface 3e.

Heat generated from the light emitting devices 4B and 4D is conducted through the light emitting device loading surface 3a to the nest frame 3. The heat is radiated through a lower surface opposite to the light emitting device loading surface 3a. Therefore, the heat is not approximately conducted to the main frame 2. The gap 6 prevents heat from being conducted to the nest frame 3.

Accordingly, by determining a radiating property of the nest frame 3, the thermal influence on the light emitting devices 4B and 4D can be reduced, even when the nest frame 3 is adjacent to other light emitting devices 4A and 4C. As a result, the temperature of the light emitting devices 4B and 4D is prevented from rising, the brightness of the light emitting devices 4B and 4D is prevented from decreasing and the lifetime of the light emitting devices 4B and 4D is prevented from deteriorating.

In the main frame 2 on which the light emitting devices 4A and 4C are arranged, the thermal insulator 5 and the gap 6 approximately insulate a thermal conductive path from the nest frame 3.

The convex parts 2A are connected to each other by the sidewall 2d. Thus, a continuous thermal conductive path between the convex parts 2A is formed. However, since the thermal conductive path of the convex parts 2A is long, the thermal influence of the convex parts 2A on each other is reduced.

Heat generated by the light emitting devices 4A and 4C is conducted through the light emitting device loading surface 2a to the convex parts 2A. The heat is radiated through a lower surface opposite to the light emitting device loading surface 2a. The gap 6 prevents heat from being conducted from a radiating surface of the convex part 2A.

Accordingly, by determining a radiating property of the convex parts 2A, the thermal influence on the light emitting devices 4A and 4C can be reduced, even when the convex parts 2A are adjacent to other light emitting devices 4B and 4D. As a result, the temperature of the light emitting devices 4A and 4C is prevented from rising, the brightness of the light emitting devices 4A and 4C is prevented from decreasing, and the lifetime of the light emitting devices 4A and 4C is prevented from deteriorating.

In the main frame 2, the light emitting devices 4A and 4C are adjacent to each other. The light emitting devices 4A and 4C are sufficiently thermally separated from each other.

In the light emitting device module 1, since the light emitting devices 4A, 4B, 4C and 4D are thermally independent from each other, examples of the light emitting devices 4A, 4B, 4C and 4D on the light emitting device loading surfaces 2a and 3a are not limited.

FIGS. 3A, 3B and 3C are plan views of examples of distributing the light emitting device module 1 according to an exemplary embodiment of the present invention. Referring to FIG. 3A, a red light emitting device R, a green light emitting device G, a blue light emitting device B and a green light emitting device G may be formed as the light emitting devices 4A, 4B, 4C and 4D, respectively. The light emitting devices 4A, 4B, 4C and 4D emit color light. Referring to FIG. 3B, four green light emitting devices G may be formed as the light emitting devices 4A, 4B, 4C and 4D. Referring to FIG. 3C, a red light emitting device R, a blue light emitting device B, a red light emitting device R and a blue light emitting device B may be formed as the light emitting devices 4A, 4B, 4C and 4D, respectively.

Since the thermal insulation between the nest frames 3 is greater than the thermal insulation between the convex parts 2A, when two light emitting devices emit light at different times, each light emitting device may be arranged on the nest frame 3. When one light emitting device is turned off, it has almost no thermal influence on the other light emitting device. Thus, the light emitting device has a good performance.

For example, although not illustrated in FIGS. 3A, 3B and 3C, when a red light emitting device R, a green light emitting device G, and a blue light emitting device B are turned sequentially and display a color separated image, the green light emitting device G, the red light emitting device R, the green light emitting device G and the blue light emitting device B are formed as the light emitting devices 4A, 4B, 4C and 4D, respectively. Accordingly, since the green light emitting devices G that emit at the same time are formed on the main frame 2, heat is insulated between the red, green, and blue light emitting devices R, G and B, even when heat is slightly conducted between the convex parts 2A.

According to exemplary embodiments of the present invention, the light emitting devices are arranged so that the widths dW and dH between adjacent light emitting devices are less than the width W and the length H of the light emitting devices, respectively. For example, when light emitted from a plurality of the light emitting devices is concentrated by one optical system, the light can be emitted about an optical axis. In this case, an obtained light source has good light efficiency. A worsening of an aberration of the light does not occur in the light source, and color spots do not occur when the light source emits color light.

According to exemplary embodiments of the present invention, the thermal insulator 5 is a heat transfer prevention unit, and is formed of materials having a thermal conductivity less than that of a radiating base, such as the main frame 2 and the nest frame 3.

Heat transfer of heat conduction can be prevented. According to exemplary embodiments of the present invention, the gap 6 of the light emitting devices ventilates an atmosphere around the radiating base reference, and constitutes a conductive prevention unit.

Heat transfer by the atmosphere can be prevented. In addition, when the atmosphere is well ventilated, radiation of the heat can be accelerated.

Figure 4A:
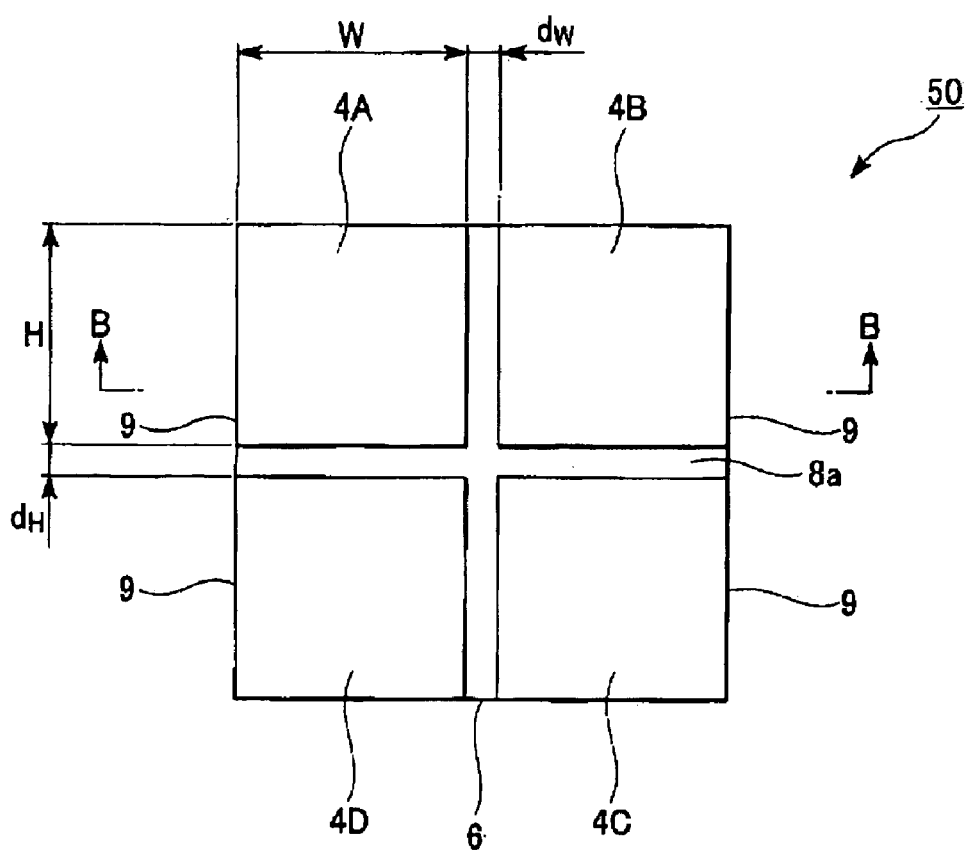
FIG. 4A is a schematic plan view of a light emitting device module according to an exemplary embodiment of the present invention.
Figure 4B:
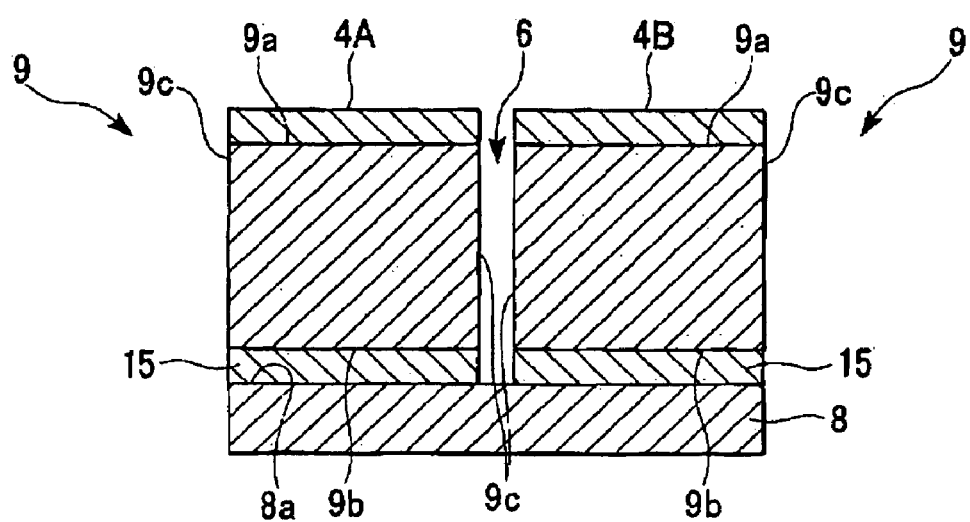
FIG. 4B is a cross-sectional view taken along a line B-B of FIG. 4A.

FIG. 4A is a schematic plan view of a light emitting device module 50 according to an exemplary embodiment of the present invention. FIG. 4B is a cross-sectional view taken along a line B-B of FIG. 4A.

Referring to FIGS. 4A and 4B, the light emitting device module 50 includes four radiating bases 9, while the light emitting device module 1 illustrated in FIG. 1A includes the main frame 2 and the nest frame 3. A heat conductor 15 which has good heat conductivity is formed between each of the radiating bases 9 and a radiating base supporter 8. The heat conductor 15 is supported by the radiating base supporter 8. Hereinafter, the light emitting device module 50 will be described in terms of features that are different from those of the light emitting device 1 of FIG. 1A.

The radiating base supporter 8 is plate-shaped. When the light emitting devices 4A, 4B, 4C and 4D are arranged as illustrated in FIGS. 1A, 1B and 2, a gap 6 is interposed between each two of the four radiating bases 9.

The materials of the radiating base supporter 8 are not limited thermally or electrically.

The shape of each of the radiating bases 9 is a block. The area of a light emitting device loading surface 9a of each of the radiating bases 9 is the same or slightly greater than the area of a light emitting surface of each of the light emitting devices 4A, 4B, 4C and 4D as seen from above, and four side surfaces 9c. In addition, a lower surface 9b opposite to a light emitting device loading surface 9a is close to the heat conductor 15.

The gap formed between the two radiating bases 9 arranged adjacent in a width W direction has a width dW. The gap formed between the two radiating bases 9 arranged adjacent in a length H direction has a width dH.

The radiating bases 9 are formed of the same materials as the main frame 2 and the nest frame 3, as illustrated in FIG. 1A.

The heat conductor 15 may be an adhesive agent which glues the radiating bases 9 to the radiating base supporter 8.

In the light emitting device module 50, heat generated from each of the light emitting devices 4A, 4B, 4C and 4D is radiated through the lower surface 9b opposite to the light emitting device loading surface 9a of each of the radiating bases 9. Meanwhile, since the gap 6 approximately insulates the radiating bases 9 from a thermal conductive path adjacent to each of the radiating bases 9, the thermal influence of the radiating bases 9 on each other is reduced. In addition, the thermal conductive path of each of the radiating bases 9 is formed through the heat conductor 15 and the radiating base supporter 8. Since the thermal conductive path is long, the thermal influence of the radiating bases 9 on each other is reduced. Since heat from the lower surface 9b is efficiently radiated from the heat conductor 15 and the radiating base supporter 8, each of the radiating bases 9 is thermally independent.

Figure 5A:
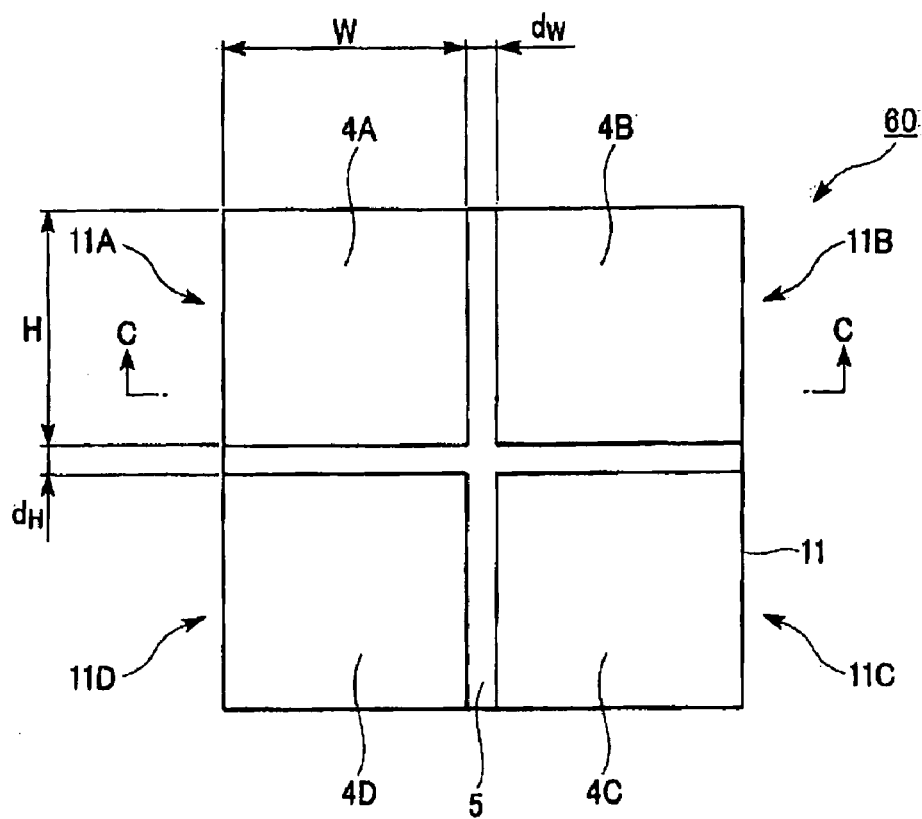
FIG. 5A is a schematic plan view of a light emitting device module according to an exemplary embodiment of the present invention.
Figure 5B:
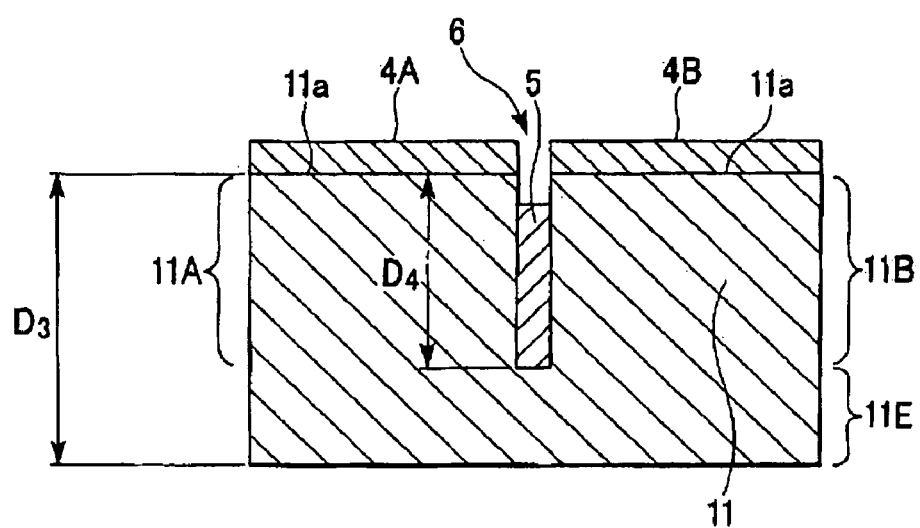
FIG. 5B is a cross-sectional view taken along a line C-C of FIG. 5A.

FIG. 5A is a schematic plan view of a light emitting device module 60 according to an exemplary embodiment of the present invention. FIG. 5B is a cross-sectional view taken along a line C-C of FIG. 5A.

Referring to FIGS. 5A and 5B, the light emitting device module 60 includes a frame 11, while the light emitting device module 1 illustrated in FIG. 1A includes the main frame 2 and the nest frame 3. Hereinafter, the light emitting device module 60 will be described in terms of features different from those of the light emitting device 1 of FIG. 1A.

The frame 11 includes radiating blocks 11A, 11B, 11C and 11D, which are separated by a predetermined interval, and each of which has a shape of a rectangular parallelepiped. The blocks 11A, 11B, 11C and 11D have widths W and H and a height D3. The frame 11 includes a gap 6. The gap 6 is +shaped and has widths dW and dH and a depth D4, where D4<D3. For example, the gap 6 is formed on a block member which has an area of (2·H+dH)×(2·W+dW) and a height of $D_3$, so that the upper surface of the block member may be divided into four parts. Thus, each of the radiating blocks 11A, 11B, 11C and 11D is formed on a lower part 11E, which has a plate shape and a height D3-D4, resulting in a rectangular parallelepiped shape.

A light emitting device loading surface 11a is formed on each of the radiating blocks 11A, 11B, 11C and 11D, on which light emitting devices 4A, 4B, 4C and 4D are respectively formed.

Each of the light emitting devices 4A, 4B, 4C and 4D is distributed to have structures as illustrated in FIGS. 1A, 1B and 2.

A thermal insulator 5 is formed in some or all parts of the gap 6 between the radiating blocks 11A, 11B, 11C and 11D. The construction of the thermal insulator 5 is the same as the construction of the thermal insulator 5 of FIG. 1A.

The frame 11 is formed of the same materials as the main frame 2 of the light emitting device module 1 of FIG. 1A. The surface condition of the light emitting device loading surface 11a is the same as the surface condition of the light emitting device loading surface 2a of the light emitting device module 1 of FIG. 1A.

In the light emitting device module 60, heat generated from the light emitting devices 4A, 4B, 4C and 4D is conducted to the radiating blocks 11A, 11B, 11C and 11D, and is radiated from the edges and a bottom surface of the frame 11. Since a thermal conductive path between each two of the adjacent radiating blocks 11A, 11B, 11C and 11D is approximately insulated in a scope at which a thermal insulator 5 is formed, heat is prevented from directly conducting.

Accordingly, by determining radiating properties of the edges and bottom surface of the frame 11, the amount of heat conduction can be reduced. Thus, thermal insulating properties of each two of the radiating blocks 11A, 11B, 11C and 11D may be achieved.

Like in the main frame 2 of FIG. 1A, by extending a thermal conductive path in the light emitting device module 60, a substantially insulated condition is created.

Accordingly, since the thermal insulator 5 is formed in the gap 6 between each two of the radiating blocks 11A, 11B, 11C and 11D, thermal insulating properties are more improved than those of the light emitting device module 1 of FIG. 1A.

As described above, one light emitting device is formed on one radiating base. However, more than one light emitting device may be formed on the radiating base. For example, when the amount of heat radiated from a plurality of turning-on light emitting devices is very small, the plurality of the light emitting devices may be formed on one radiating base.

According to exemplary embodiments of the present invention, the number of light emitting devices is four. However, the number of light emitting devices is not limited to four. The number of the light emitting devices may be two or more.

In the above description, the atmosphere is in the immediate vicinity of the light emitting devices and the light emitting device module. Accordingly, the light emitting device module may be covered with light transparent resins to be packaged.

The light transparent resins may be directly formed on the light emitting device, in which case the thermal insulating properties between the adjacent radiating base and the radiating surface opposite to the radiating base should be maintained.

Here, heat from the light emitting device and from a radiating surface other than the radiating surface opposite to the radiating base is radiated into the packaged light emitting device module, or is conducted through the resins of the packaged light emitting device module to be radiated to the outside. Alternatively, when the thermal conductivity of the resins is poor, heat is conducted to be radiated through the radiating base and from the radiating surface.

The constructions of the present invention may be organized accordingly without departing from the spirit and scope of the present invention. For example, the heat transfer prevention unit includes only the gap 6, as illustrated in FIG. 4B. However, the heat transfer prevention unit may include the thermal insulator 5 in combination with the gap 6, or it may not include the gap in the heat transfer prevention unit. Alternatively, the thermal insulator 5 may be formed instead of the heat conductor 15.

The cases will be described when terms of exemplary embodiments of the present invention correspond to different terms of the claims. A red light emitting device R, a green light emitting device G and a blue light emitting device B are light emitting devices according to exemplary embodiments of the present invention. The main frame 2, the nest frame 3, the radiating base 9 and the radiating blocks 11A, 11B, 11C and 11D are radiating bases according to exemplary embodiments of the present invention. The thermal insulator 5 is a heat conductive preventing unit according to an exemplary embodiment of the present invention. The gap 6 is a heat conductive preventing unit according to an exemplary embodiment of the present invention.

In the light emitting device module of the present invention, by forming a heat transfer prevention unit to prevent heat conduction between radiating bases, a thermal influence of light emitting devices formed on other radiating bases on each other can be reduced. Accordingly, even when a plurality of light emitting devices are adjacently formed, the lifetime of the light emitting devices can be increased. In addition, the light emitting device module of the present invention prevents brightness of light from being decreased due to the thermal influence.

While the present invention has been particularly shown and described with reference to exemplary embodiments thereof, it will be understood by those of ordinary skill in the art that various changes in form and details may be made therein without departing from the spirit and scope of the present invention as defined by the following claims and their legal equivalents.

What is claimed is:

1. A light emitting device module comprising:
a plurality of light emitting devices which are formed adjacent to each other;
a plurality of radiating bases which support at least one of the plurality of the light emitting devices; and
a heat transfer prevention unit which prevents heat from being conducted between the plurality of the radiating bases,
wherein distances between the adjacent light emitting devices are less than mean values of the length of the light emitting device along the adjacent direction of the adjacent light emitting devices, and
wherein the heat transfer prevention unit comprises a thermal insulator which is formed of a material which has less thermal conductivity than the radiating bases.

2. The light emitting device module of claim 1, wherein the heat transfer prevention unit further comprises a gap which is formed between adjacent radiating bases, and ventilates an atmosphere around the radiating bases.

3. The light emitting device module of claim 1, wherein the plurality of radiating bases is formed by a gap which has a + shape, and has a predetermined width and depth on a frame so that the frame is divided into four parts.

4. The light emitting device module of claim 3, wherein a thermal insulator is formed in the gap which has the + shape.

5. A light emitting device module comprising:
a plurality of light emitting devices which are formed adjacent to each other;
a plurality of radiating bases which support at least one of the plurality of the light emitting devices; and
a heat transfer prevention unit which prevents heat from being conducted between the plurality of the radiating bases,
wherein distances between the adjacent light emitting devices are less than mean values of the length of the light emitting device along the adjacent direction of the adjacent light emitting devices, and
wherein each of the radiating bases comprises:
a main frame which comprises a plurality of through hole parts formed in one diagonal direction with respect to each other, and a plurality of convex parts formed in another diagonal direction with respect to each other, wherein one surface of each of the convex parts is a light emitting device loading surface; and
a nest frame which is formed in each of the through hole parts, wherein one surface of the nest frame is a light emitting device loading surface; and
wherein a gap is formed between the main frame and the nest frame.

6. The light emitting device module of claim 5, wherein a thermal insulator is formed in the gap.

7. The light emitting device module of claim 6, wherein, when light emitting devices emit light at different times, each of the light emitting devices which emit light at different times is loaded on the nest frame.

8. The light emitting device module of claim 5, wherein, when light emitting devices emit light at different times, each of the light emitting devices which emit light at different times is loaded on the nest frame.

9. A light emitting device module comprising:
a plurality of light emitting devices which are formed adjacent to each other;
a plurality of radiating bases which support at least one of the plurality of the light emitting devices; and
a heat transfer prevention unit which prevents heat from being conducted between the plurality of the radiating bases,
wherein distances between the adjacent light emitting devices are less than mean values of the length of the light emitting device along the adjacent direction of the adjacent light emitting devices, and
wherein the radiating bases are loaded on a radiating base supporter, and a heat conductor is formed between each of the radiating bases and the radiating base supporter.

* * * * *